(12) United States Patent
Oslick

(10) Patent No.: US 7,804,428 B2
(45) Date of Patent: Sep. 28, 2010

(54) SYSTEM AND METHOD FOR COMPRESSING A STREAM OF INTEGER-VALUED DATA

(75) Inventor: Mitchell Howard Oslick, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 26 days.

(21) Appl. No.: 12/268,171

(22) Filed: Nov. 10, 2008

(65) Prior Publication Data

US 2010/0117875 A1 May 13, 2010

(51) Int. Cl.
H03M 7/00 (2006.01)
(52) U.S. Cl. .............................. 341/59; 341/51; 341/63
(58) Field of Classification Search ................... 341/59, 341/63
See application file for complete search history.

(56) References Cited

U.S. PATENT DOCUMENTS

| | | | | |
|---|---|---|---|---|
| 5,710,561 | A | * | 1/1998 | Schmidt et al. ................ 341/63 |
| 5,798,718 | A | | 8/1998 | Hadady |
| 5,818,363 | A | * | 10/1998 | Kim ............................. 341/63 |
| 5,831,559 | A | * | 11/1998 | Agarwal et al. ............... 341/106 |
| 5,926,576 | A | | 7/1999 | Newton |
| 6,011,499 | A | | 1/2000 | Agarwal et al. |
| 6,049,633 | A | | 4/2000 | Cho |
| 6,118,392 | A | | 9/2000 | Levine |
| 6,140,944 | A | * | 10/2000 | Toyoyama .................... 341/63 |
| 6,166,664 | A | | 12/2000 | Acharya |
| 6,484,142 | B1 | | 11/2002 | Miyasaka et al. |
| 6,505,320 | B1 | | 1/2003 | Turk et al. |
| 6,711,295 | B2 | | 3/2004 | Nakayama et al. |
| 6,778,483 | B2 | | 8/2004 | Mouri et al. |
| 6,987,468 | B1 | | 1/2006 | Malvar |
| 7,015,837 | B1 | | 3/2006 | Malvar |
| 7,068,192 | B1 | | 6/2006 | Dean et al. |
| 7,113,115 | B2 | * | 9/2006 | Partiwala et al. .............. 341/67 |
| 7,245,235 | B2 | | 7/2007 | Malvar |
| RE39,984 | E | | 1/2008 | Kajiwara |
| 2003/0137438 | A1 | | 7/2003 | Yokose |
| 2005/0015249 | A1 | | 1/2005 | Mehrotra et al. |
| 2007/0233076 | A1 | | 10/2007 | Trieu |
| 2008/0144717 | A1 | | 6/2008 | Zhu et al. |
| 2009/0256730 | A1 | * | 10/2009 | Patel ............................ 341/51 |

OTHER PUBLICATIONS

International Search Report, mailed Mar. 2, 2010, from corresponding International Application No. PCT/US2009/063526.
Salomon, David, "Data Compression: The Complete Reference," 3rd Edition (2004), pp. 168-171, XP002567706, pp. 51-53.
Itoh et al., " Universal Variable Length Code for DCT Coding," Proceedings of International Conference on Sep. 10-13, 2000, IEEE, Piscataway, NJ, USA, vol. 1, pp. 940-943, XP010530771.
Reed et al., "Efficient Coding of DCT Coefficients by Joint Position-Dependent Encoding," Acoustics, Speech and Signal Processing, 1998, Proceedings of the 1998 IEEE International Conference in Seattle, WA, USA, May 12-15, 1998, vol. 5, pp. 2817-2820, XP010279416.
Weinberger et al., "The LOCO-I Lossless Image Compression Algorithm: Principles and Standardization into JPEG-LS," IEEE Transactions on Image Processing, 9(8): 1316 (2000), XP011025643.

* cited by examiner

*Primary Examiner*—Khai M Nguyen
(74) *Attorney, Agent, or Firm*—Kenyon & Kenyon LLP

(57) ABSTRACT

A method and system are provided to minimize the size and complexity of bitstreams associated with encoded data by using a new compression scheme. An entropy encoder receives a list of run/data value pairs and entropy encodes separately the runs and data values, selecting their codewords according to length and magnitude, respectively, and catenates the resulting codeword pairs—run codeword first—in an encoded bitstream.

45 Claims, 3 Drawing Sheets

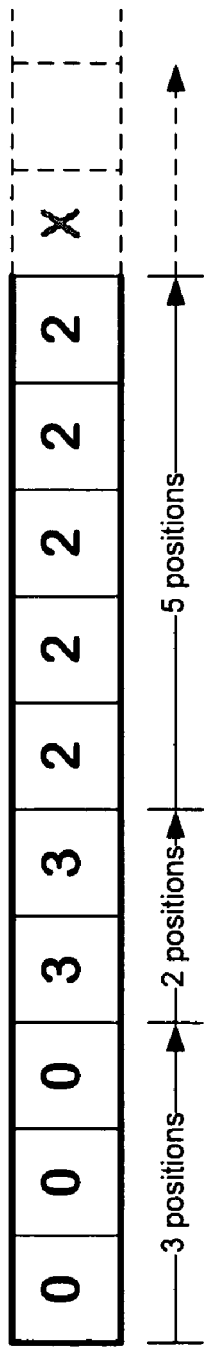
FIG. 3
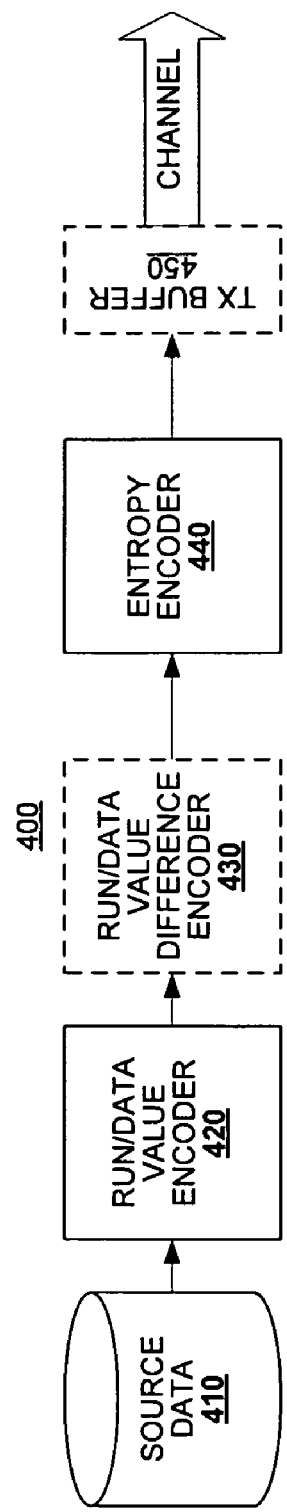
FIG. 4
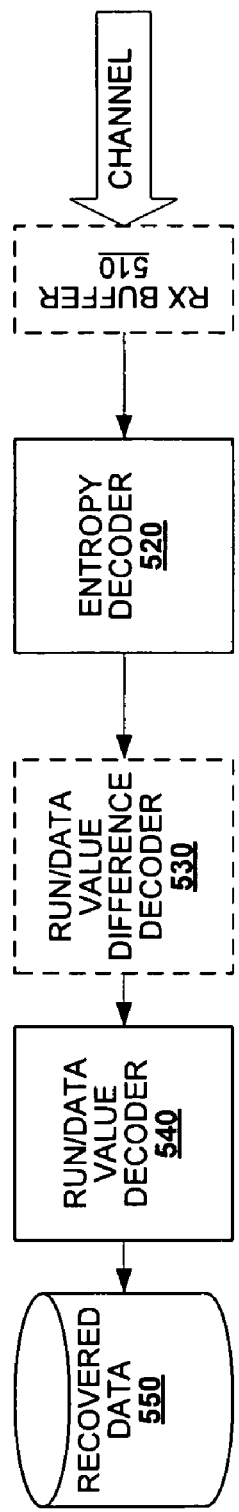

SYSTEM AND METHOD FOR COMPRESSING A STREAM OF INTEGER-VALUED DATA

BACKGROUND

Various encoding schemes are known for encoding integer-valued bitstreams, which bitstreams may represent, for example, videos, images, etc. The known encoding schemes generally involve run-length coding, variable-length coding, differential coding, and various combinations thereof.

It is known that run-length coding, while useful for compressing data exhibiting significant uniformity, is generally inefficient where data values are likely to differ from one to the next. In the latter situation, it is common among known compression schemes to adaptively switch between run-length coding and some other type of coding, which switching generally is handled in the decoder by side-information associated with the bitstream, or by calculation; this either reduces compression efficiency or increases the computational burden, respectively.

It is common among compression schemes that use both run-length and differential coding, to do the differential coding before the run-length coding, which ordering requires the encoder to calculate a difference, and the decoder to calculate a sum (i.e., to reconstruct the data value) for every data value in the bitstream.

Thus, it is desirable to use a coding scheme that can eliminate or at the very least mitigate these known limitations.

BRIEF DESCRIPTION OF THE DRAWINGS

FIG. 3 illustrates an exemplary stream of integer-valued data, and its associated runs.

FIG. 4 illustrates a coder-decoder system according to an embodiment of the present invention.

DETAILED DESCRIPTION

Embodiments of the present invention reduce the size and complexity of bitstreams associated with encoded data by using a new compression scheme. An entropy encoder receives a list of run/data value pairs and entropy encodes separately the runs and data values, selecting their codewords according to length and magnitude, respectively, and catenates the resulting codeword pairs—data value codeword first—in an encoded bitstream. The coding scheme reduces the size and complexity of an encoded bitstream, which bitstream may represent images, videos, etc. Thus, the bitstream may be transmitted with less bandwidth, and the computational burden on both the encoder and decoder may be lessened.

Figure 1:
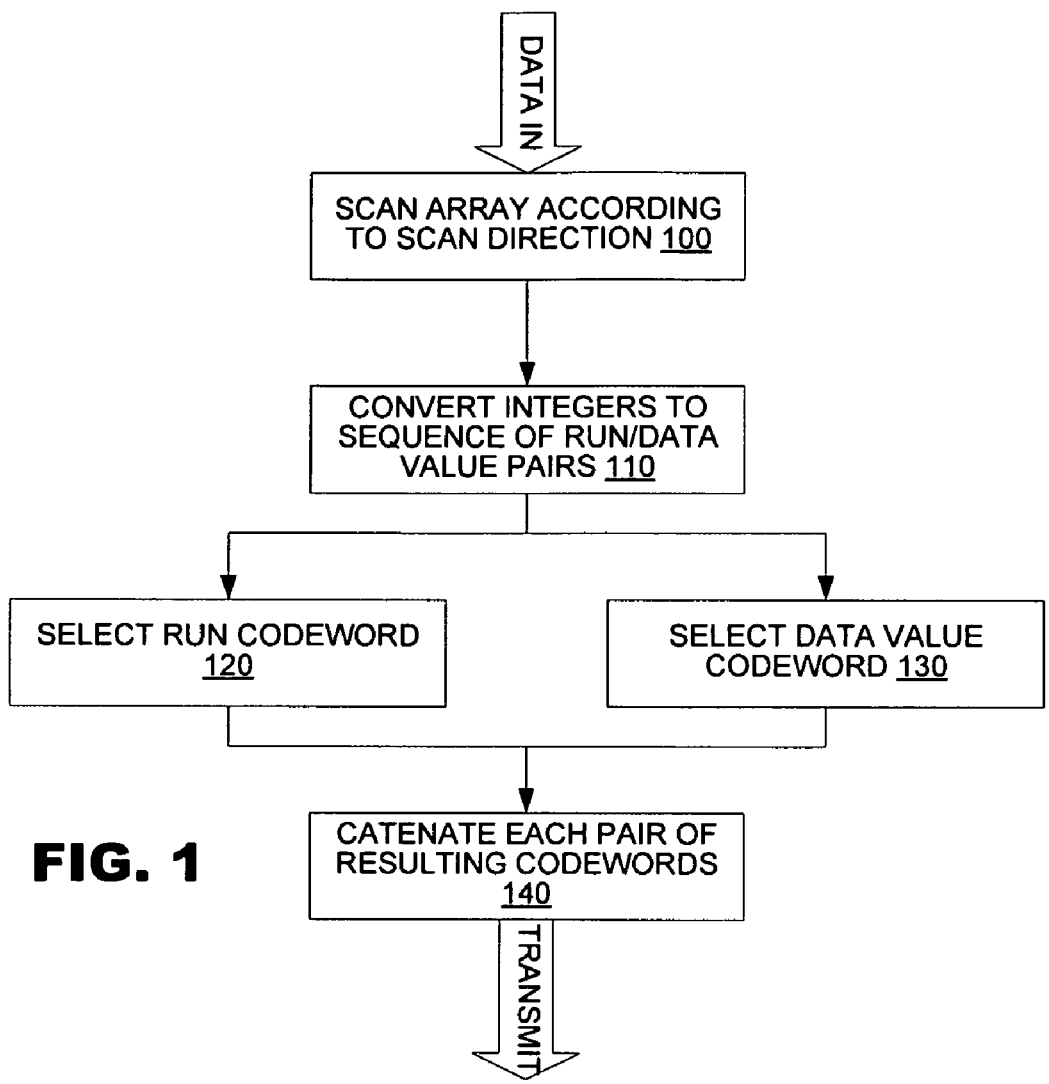
FIG. 1 illustrates a method of encoding a stream of integer-valued data according to an embodiment of the present invention.

FIG. 1 illustrates a method of encoding a bitstream according to an embodiment of the present invention. According to the embodiment, the method may scan an array of data values according to a predetermined scan direction (box 100). The method may convert data values from the array into a sequence of run/data value pairs (box 110). At box 120, the method may select a codeword based on a value of a run. Similarly, at box 130, the method may select a codeword based on a value of a data value. The method may perform either step 120 or step 130 or both. The method may catenate the coded run/data value data into coded data pairs (box 140). Thereafter, the data may by processed further for transmission.

More specifically, at block 100, the method may scan an array of source data according to a scan direction, which source data represents, for example, an image, a video, etc. The method may accommodate data arrays of a variety of sizes and configurations. It will be appreciated that multi-dimensional arrays of integers may be regarded as a linear array when considered according to a scan direction and, therefore, the present discussion is addressed to a linear array case.

At block 110, the one-dimensional array of data values may be converted, using run-length encoding, into a list of run/data value pairs, where one integer (commonly, the first integer) in the pair is the length of the run, and another integer (commonly, the second integer) is the value of the data comprising the corresponding run. For example, and as shown in FIG. 3, if the one-dimensional array consists of 10 elements—{0, 0, 0, 3, 3, 2, 2, 2, 2, 2}—those 10 elements would be converted into the following pairs: {(3, 0), (2, 3), (5,2)}. The resulting pairs indicate that the original array consisted of three values equal to 0, two values equal to 3, and five values equal to 2, and in that order.

In an embodiment, the resulting list of run/data value pairs may be difference encoded, at block 110, into a list of run/data value difference pairs. Going back to the example 10-element array used above, the resulting list of run/data value difference pairs consists of {(3, +1), (2, +3), (5, −1)}, where [0−(−1)=+1], [3−0=+3], and [2−3=−1]. Under ordinary circumstances the data value difference will not be zero, as that would imply a continuation of the previous run; by treating the initial run's previous run value as −1 (as shown in the example above), a non-zero data value difference may be guaranteed (unless a run is broken into sub-runs, as detailed herein).

By doing run-length coding before difference coding, a difference (encoder) or sum (decoder) needs to be calculated only once per run, instead of once per every data value. This ordering distinction may be especially valuable in the decoder, where it not only reduces the amount of calculation required, but also eliminates any associated serialism, which permits several of the identical data values of a run to be output simultaneously.

As discussed above, the principles of the present invention find application both with differential data values and non-differential data values. Therefore, unless specified below, the discussion below refers to "data values" in a generic sense, to refer equally to differential and non-differential data values.

At blocks 120, 130 the resulting list of run/data value pairs may be entropy coded; the runs may be coded separately from the data values and such encoding may be done serially (e.g., runs before data values, etc.) or in parallel. Embodiments of the present invention permit the codebook-based entropy coding proposed herein to be used in conjunction with other coding schemes, if desired. For example, although the present discussion proposes to code both runs and data values according to the process outlined below with regard to FIG. 2, it is permissible to code only one data type (say, the runs) according to the scheme proposed and to code the other data type (e.g., data values) according to another mechanism. Thus, the principles of the present invention may be integrated with other coding mechanisms as may be desired.

After the runs and data values have been entropy coded, the list of run codewords/data value codewords may be catenated (i.e., for each pair, the resulting data value codeword is catenated with the resulting run codeword), and these catenated codewords together form the final encoded bitstream, as shown at block 140. By putting the data value codeword before the corresponding run codeword, the data value can be reconstructed—during decoding—prior to the determination of the length of that data value's run, which allows for specialized run-length decoding of particular run values. For example, if, during run codeword decoding, it is determined that the run is one, the single data value can be outputted, because the data value has already been recovered; thus, there is no need to do a loop or otherwise try to accommodate a general situation, which means that some computational overhead can be removed from the process.

Figure 2:
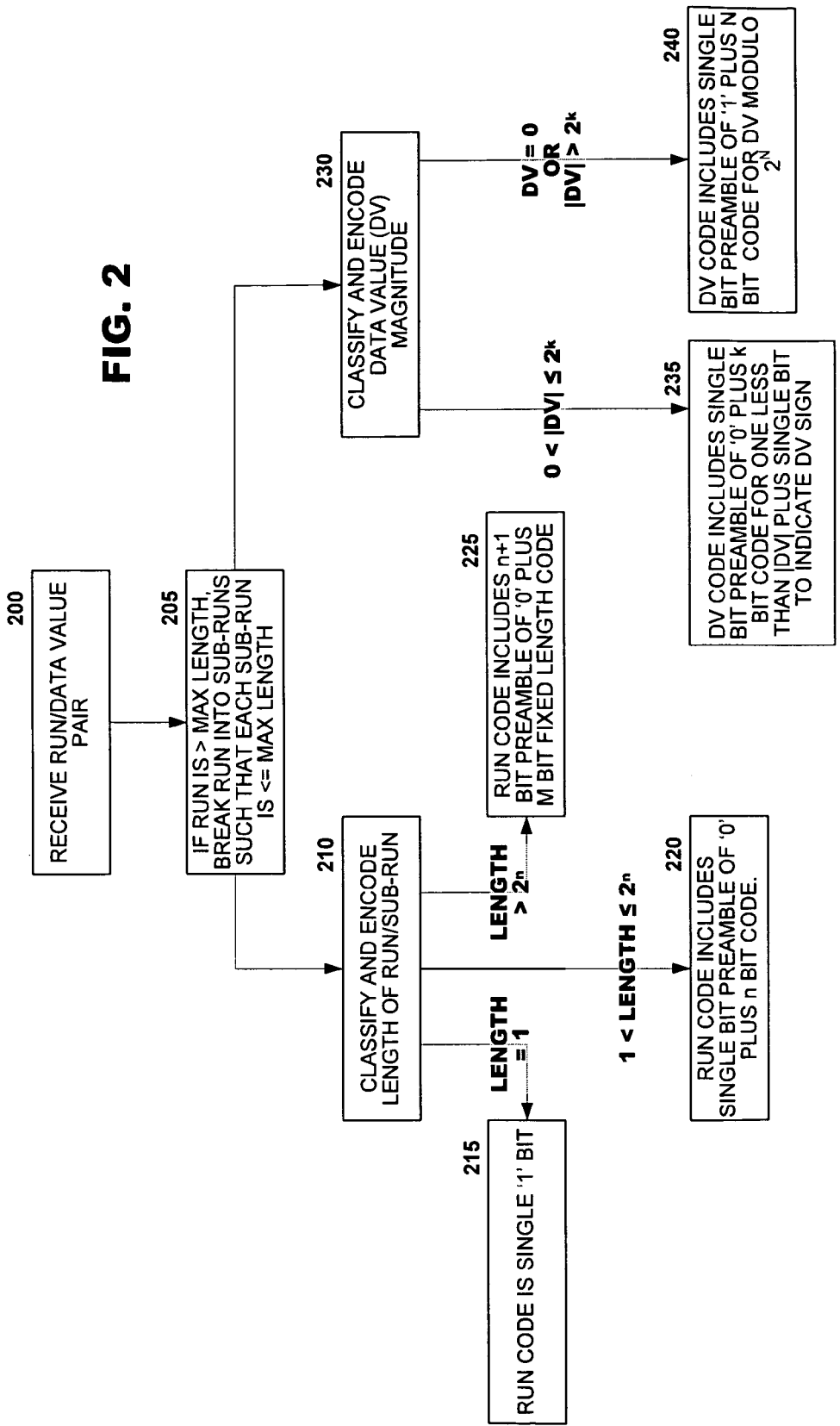
FIG. 2 illustrates a method of encoding a list of run/data value pairs according to an embodiment of the present invention.

FIG. 2 illustrates a method of entropy coding according to an embodiment of the present invention. At block 200, a run/data value pair is received, and at block 205 the runs within each pair are checked to see if they are within a predetermined maximum run length. Runs are integral and can range from 1 to the size of the source array. For the purposes of entropy coding, run lengths may have an upper limit of, for example, $2^M$, where M is a general parameter used to ensure that the size of the run codebook is finite. For example, with respect to an image, M may be commensurate with the size of the image so that runs need not be broken into sub-runs.

Should a run be longer than $2^M$, it may be split into sub-runs such that each sub-run is less than or equal to $2^M$. In the case of a run being split into sub-runs, the first sub-run gets the same data value as if the run was not broken into sub-runs, and each subsequent sub-run gets a data value of zero. As an example, consider the run/data value pair (21, +2), where M=3. In this case, runs cannot be longer than 8 (i.e., $2^M=2^3=8$), and so the resulting sub-runs/data value pairs would be: {(8, +2), (8, 0), (5, 0)} (i.e., 8+8+5=21).

Depending on their length, runs or sub-runs may be encoded in one of three ways, as shown at blocks 210-225. At block 210, a run is classified as either one, "short" or "long." Runs of one may be coded as a single '1' bit, as depicted by block 215. Using a single bit for runs of one minimizes the impact on compression efficiency when contiguous data values are not identical, and has the computational advantage of allowing decoders to use a sign test to distinguish between coded runs of one and those greater than one.

"Short" runs may include those runs greater than 1, but less than or equal to a predetermined threshold $2^n$, where n may be chosen arbitrarily or according to any of a number of predetermined schemes, including, for example, a scheme that attempts to achieve optimum compression for the data being compressed. Short runs may be coded with n+1 bits consisting of a single '0' bit preamble followed by the n-bit fixed-length binary code for one less than the run value, as depicted by block 220.

"Long" runs may include those runs greater than $2^n$. Long runs may be coded with n+1+M bits consisting of a preamble of n+1 '0' bits followed by the M-bit fixed-length binary code for one less than the run value, as depicted by block 225.

Note that the codewords for both "short" and "long" runs are the fixed-length binary codes—of appropriate length—for one less than the run value. As an example of a run codebook according to the discussed scheme, consider Table 1, which illustrates a run codebook where M=11 and n=4, such that the maximum length of a run is 2048 (i.e., $2^{11}=2048$), and "short" runs are those between 2 and 16 inclusive (i.e., $2^4=16$).

TABLE 1

| CLASSIFICATION | RUN | CODEWORD PREAMBLE | CODEWORD DATA |
|---|---|---|---|
| 1 | 1 | | 1 |
| Short | 2 | 0 | 0001 |
| Short | 3 | 0 | 0010 |
| ... | ... | ... | ... |
| Short | 16 | 0 | 1111 |
| Long | 17 | 00000 | 00000010000 |
| Long | 18 | 00000 | 00000010001 |
| ... | ... | ... | ... |
| Long | 2048 | 00000 | 11111111111 |

Data values may be coded in one of two ways, depending on their magnitude. As shown at block 230, data values are classified as either "small" or "large" according to their absolute values; this allows a single prefix bit to distinguish between the two cases, and consequently, when decoding a data value codeword, if the first bit of the codeword appears in the most-significant bit of a computer's word, a simple sign test (comparison to zero) may be performed to determine whether the data value is small or large.

"Small" data values may include those data values with a magnitude (i.e., an absolute value) greater than 0, but less than or equal to $2^k$, where k may be chosen arbitrarily or according to any of a number of predetermined schemes, including, for example, a scheme that attempts to achieve optimum compression for the data being compressed. Small data values are coded with k+2 bits consisting of a single '0' bit preamble, the k-bit fixed-length binary code for one less than the data value magnitude, and a single bit to indicate the difference sign, as depicted by block 235.

"Large" data values may include those data values with a magnitude either equal to 0 or greater than $2^k$. Large data values may be coded with N+1 bits consisting of a single '1' bit preamble followed by the data value modulo $2^N$, as depicted by block 240, where N is the wordsize of the original data values.

As an example of a data value codebook according to the discussed scheme, consider Table 2, which illustrates a data value codebook where k=3 and N=8, and where a sign bit of 1 is used to indicate negative data values, such that the codebook comprises 512 entries (i.e., $2*2^8=512$).

TABLE 2

| CLASSIFICATION | DATA VALUE | CODEWORD PREAMBLE | CODEWORD DATA | CODEWORD SIGN |
|---|---|---|---|---|
| Small | +1 | 0 | 000 | 0 |
| Small | −1 | 0 | 000 | 1 |
| Small | +2 | 0 | 001 | 0 |
| Small | −2 | 0 | 001 | 1 |
| Small | ... | ... | ... | ... |
| Small | +8 | 0 | 111 | 0 |
| Small | −8 | 0 | 111 | 1 |
| Large | +9 | 1 | 00001001 | |
| Large | −9 | 1 | 11110111 | |
| | ... | ... | ... | ... |
| Large | +255 | 1 | 11111111 | |
| Large | −255 | 1 | 00000001 | |
| Large | +256 | 1 | 00000000 | |
| Large | 0 | 1 | 00000000 | |

The variables n (associated with the entropy coding of runs) and k (associated with the entropy coding of data values) may be based on statistical information collected from example data that is presumably representative of the types of things that may be encoded by the encoder (e.g., pictures, videos, etc.).

FIG. 4 illustrates an encoder 400 and a decoder 500 according to an embodiment of the present invention. Encoder 400 may be implemented in hardware or software and receives source data 410, a one-dimensional array of integer-valued data, as detailed herein. Source data 410 may be the result of various other coding processes that are generally immaterial to the present invention, including source processing operations (e.g., video coding processes, audio coding processes, etc.).

Run/data value encoder 420 may run-length encode source data 410 into a list of run/data value pairs. Entropy encoder 440 may receive the list of run/data value pairs from run/data value encoder 420 and separately may encode runs and data values according to the processes detailed herein. Entropy encoder 440 may catenate the resulting codewords comprising each pair in the list, coded data values first, to form the encoded bitstream. In an embodiment, and as shown in phantom, run/data value difference encoder 430 may receive the list of run/data value pairs from run/data value encoder 420 and may difference encode the pairs into a list of run/data value difference pairs, which may be processed by entropy encoder 440.

Transmission buffer 450 may store the encoded bitstream before transferring it to a channel, which channel may represent a transmission medium to carry the encoded bitstream to a decoder. Channels typically include storage devices such as optical, magnetic or electrical memories and communications channels provided, for example, by communications networks or computer networks.

The encoding process described above may be reversed in decoder 500, which may include receive buffer 510, entropy decoder 520, run/data value difference decoder 530, run/data value decoder 540, and recovered data store 550. Each unit may perform the inverse of its counterpart in encoder 400, replicating source data 410. Decoder 500 may include other blocks (not shown) that perform source decoding to match source coding processes applied at encoder 400.

Although the preceding text sets forth a detailed description of various embodiments, it should be understood that the legal scope of the invention is defined by the words of the claims set forth below. The detailed description is to be construed as exemplary only and does not describe every possible embodiment of the invention since describing every possible embodiment would be impractical, if not impossible. Numerous alternative embodiments could be implemented, using either current technology or technology developed after the filing date of this patent, which would still fall within the scope of the claims defining the invention.

It should be understood that there exist implementations of other variations and modifications of the invention and its various aspects, as may be readily apparent to those of ordinary skill in the art, and that the invention is not limited by specific embodiments described herein. It is therefore contemplated to cover any and all modifications, variations or equivalents that fall within the scope of the basic underlying principals disclosed and claimed herein.

I claim:

1. A method for entropy coding run/data value pair data corresponding to a stream of integer-valued data, said method comprising:
classifying each run based on its length;
if the run is 1, selecting a first code with a length of 1;
if the run is classified as short, selecting a first code with a first predetermined length, each first code of first predetermined length having a preamble to distinguish the other run classifications, and having a value based on the run's length;
if the run is classified as long, selecting a first code with a second predetermined length, each first code of second predetermined length having a preamble to distinguish the other run classifications, and having a value based on the run's length; and
outputting the selected first code to a channel.

2. The method of claim 1 wherein the data value is differential data obtained from two adjacent data values in the stream.

3. The method of claim 1 further comprising outputting to the channel a coded representation of the data value corresponding to the run in the run/data value pair, before outputting the selected first code to the channel.

4. The method of claim 1 further comprising:
classifying each data value based on its magnitude;
if the data value is classified as small, selecting a second code with a third predetermined length, each second code of third predetermined length having a preamble to distinguish large data values, and having a value based on the data value;
if the data value is classified as large, selecting a second code with a fourth predetermined length, each second code of fourth predetermined length having a preamble to distinguish small data values, and having a value based on the data value; and
outputting the selected second code to the channel.

5. The method of claim 1 wherein:
a short run's length is greater than 1 and less than or equal to a predetermined threshold; and
a long run's length is greater than the predetermined threshold.

6. The method of claim 1 wherein the stream represents a video.

7. The method of claim 1 wherein the stream represents an image.

8. A method for entropy coding run/data value pair data corresponding to a stream of integer-valued data, said method comprising:
classifying each data value based on its magnitude;
if the data value is classified as small, selecting a first code with a first predetermined length, each first code of first predetermined length having a preamble to distinguish large data values, and having a value based on the data value;
if the data value is classified as large, selecting a first code with a second predetermined length, each first code of second predetermined length having a preamble to distinguish small data values, and having a value based on the data value; and
outputting the selected first code to a channel.

9. The method of claim 8 wherein the data value is differential data obtained from two adjacent data values in the stream.

10. The method of claim 8 further comprising outputting to the channel a coded representation of the run corresponding to the data value in the run/data value pair, after outputting the selected first code to the channel.

11. The method of claim 8 further comprising:
classifying each run based on its length;
if the run is 1, selecting a second code with a length of 1;
if the run is classified as short, selecting a second code with a third predetermined length, each second code of third predetermined length having a preamble to distinguish the other run classifications, and having a value based on the run's length;

if the run is classified as long, selecting a second code with a fourth predetermined length, each second code of fourth predetermined length having a preamble to distinguish the other run classifications, and having a value based on the run's length; and outputting the selected second code to the channel.

12. The method of claim 8 wherein the stream represents a video.

13. The method of claim 8 wherein the stream represents an image.

14. The method of claim 8 wherein a small data value is a data value whose magnitude is greater than zero and less than or equal to a predetermined threshold.

15. A method for entropy coding run/data value pair data corresponding to a stream of integer-valued data, said method comprising:

classifying each run based on its length;

if the run is 1, selecting a first code comprising a single bit;

if the run is classified as short, selecting a first code comprising n+1 bits from a first codebook, the selected first code having a predetermined preamble for the first bit and whose value for the remaining n bits is based on the run's length;

if the run is classified as long, selecting a first code comprising n+1+M bits from a second codebook, the selected first code having a predetermined preamble for the first n+1 bits and whose value for the remaining M bits is based on the run's length; and outputting the selected first code to a channel.

16. The method of claim 15 wherein the data value is differential data obtained from two adjacent data values in the stream.

17. The method of claim 15 further comprising outputting to the channel a coded representation of the data value corresponding to the run in the run/data value pair, before outputting the selected first code to the channel.

18. The method of claim 15 further comprising:

classifying each data value based on its magnitude;

if the data value is classified as small, selecting a second code comprising k+2 bits from a third codebook, the selected second code having a predetermined preamble for the first bit and whose value for the remaining k+1 bits is based on the data value;

if the data value is classified as large, selecting a second code comprising N+1 bits from a fourth codebook, the selected second code having a predetermined preamble for the first bit and whose value for the remaining N bits is based on the data value and N; and outputting the selected second code to the channel.

19. The method of claim 15 wherein the stream represents a video.

20. The method of claim 15 wherein the stream represents an image.

21. The method of claim 15 wherein:

a short run's length is greater than 1 and less than or equal to $2^n$; and a long run's length is greater than $2^n$.

22. The method of claim 15 wherein, for runs classified as short:

the predetermined preamble is a '0' bit; and the value of the remaining n bits is the binary code for one less than the run's length.

23. The method of claim 15 wherein, for runs classified as long:

the predetermined preamble is n+1 '0' bits; and the value of the remaining M bits is the binary code for one less than the run's length.

24. The method of claim 15 further comprising splitting a run into two or more sub-runs when a run's length is greater than $2^M$, wherein:

the length of each of the sub-runs is less than or equal to $2^M$;

the data value associated with the first sub-run is equal to the data value associated with the run; and the data value associated with each sub-run after the first sub-run is zero.

25. A method for entropy coding run/data value pair data corresponding to a stream of integer-valued data, said method comprising:

classifying each data value based on its magnitude;

if the data value is classified as small, selecting a first code comprising k+2 bits from a first codebook, the selected first code having a predetermined preamble for the first bit and whose value for the remaining k+1 bits is based on the data value;

if the data value is classified as large, selecting a first code comprising N+1 bits from a second codebook, the selected first code having a predetermined preamble for the first bit and whose value for the remaining N bits is based on the data value and N; and outputting the selected first code to a channel.

26. The method of claim 25 wherein the data value is differential data obtained from two adjacent data values in the stream.

27. The method of claim 25 further comprising outputting to the channel a coded representation of the run corresponding to the data value in the run/data value pair, after outputting the selected first code to the channel.

28. The method of claim 25 further comprising:

classifying each run based on its length;

if the run is 1, selecting a second code comprising a single bit;

if the run is classified as short, selecting a second code comprising n+1 bits from a third codebook, the selected second code having a predetermined preamble for the first bit and whose value for the remaining n bits is based on the run's length;

if the run is classified as long, selecting a second code comprising n+1+M bits from a fourth codebook, the selected first code having a predetermined preamble for the first n+1 bits and whose value for the remaining M bits is based on the run's length; and outputting the selected second code to the channel.

29. The method of claim 25 wherein the stream represents a video.

30. The method of claim 25 wherein the stream represents an image.

31. The method of claim 25 wherein a small data value is a data value whose magnitude is greater than zero and less than or equal to $2^k$.

32. The method of claim 25 wherein, for data values classified as small:

the predetermined preamble is a '0' bit; and the value of the remaining k+1 bits is the binary code for one less than the absolute value of the data value, where one bit is used to indicate whether the data value is positive or negative.

33. The method of claim 25 wherein, for data values classified as large:

the predetermined preamble is a '1' bit; and the value of the remaining N bits is the binary code for the data value modulo $2^N$.

34. The method of claim 25 wherein N is equal to the wordsize of the data values.

35. A system for entropy coding a list of run/data value pair data corresponding to a stream of integer-valued data, said system comprising:
  an entropy encoder having an input to receive the list, the entropy encoder to:
    entropy encode the list of run/data value pairs into a list of run codeword/data value codeword pairs, wherein the runs are encoded separately from the data values; and
    generate an encoded bitstream by catenating, for every run codeword/data value codeword pair, the data value codeword with its corresponding run codeword, wherein the data value codeword appears before the run codeword in the encoded bitstream.

36. The system of claim 35 wherein the data value is differential data obtained from two adjacent data values in the stream.

37. The system of claim 35 wherein the encoded bitstream is outputted to a channel.

38. The system of claim 35 wherein each run codeword is based on the length of the run.

39. The system of claim 38 wherein:
  if the length of the run is 1, the run codeword comprises a single bit;
  if the length of the run is short, the run codeword comprises n+1 bits having a predetermined preamble for the first bit and whose value for the remaining n bits is based on the run's length; and
  if the length of the run is long, the run codeword comprises n+1+M bits having a predetermined preamble for the first n+1 bits and whose value for the remaining M bits is based on the run's length.

40. The system of claim 35 wherein each data value codeword is based on the magnitude of the data value.

41. The system of claim 40 wherein:
  if the magnitude of the data value is small, the data value codeword comprises k+2 bits having a predetermined preamble for the first bit and whose value for the remaining k+1 bits is based on the data value;
  if the magnitude of the data value is large, the data value codeword comprises N+1 bits having a predetermined preamble for the first bit and whose value for the remaining N bits is based on the data value and N; and
  if the data value is zero, the data value codeword comprises N+1 bits having a predetermined preamble for the first bit and whose value for the remaining N bits is based on the data value and N.

42. A computer-readable medium encoded with a set of instructions which, when performed by a computer, perform a method for entropy coding run/data value pair data corresponding to a stream of integer-valued data, said method comprising:
  classifying each run based on its length;
  if the run is 1, selecting a first code with a length of 1;
  if the run is classified as short, selecting a first code with a first predetermined length, each first code of first predetermined length having a preamble to distinguish the other run classifications, and having a value based on the run's length;
  if the run is classified as long, selecting a first code with a second predetermined length, each first code of second predetermined length having a preamble to distinguish the other run classifications, and having a value based on the run's length; and
  outputting the selected first code to a channel.

43. A computer-readable medium encoded with a set of instructions which, when performed by a computer, perform a method for entropy coding run/data value pair data corresponding to a stream of integer-valued data, said method comprising:
  classifying each run based on its length;
  if the run is 1, selecting a first code comprising a single bit;
  if the run is classified as short, selecting a first code comprising n+1 bits from a first codebook, the selected first code having a predetermined preamble for the first bit and whose value for the remaining n bits is based on the run's length;
  if the run is classified as long, selecting a first code comprising n+1+M bits from a second codebook, the selected first code having a predetermined preamble for the first n+1 bits and whose value for the remaining M bits is based on the run's length; and
  outputting the selected first code to a channel.

44. A computer-readable medium encoded with a set of instructions which, when performed by a computer, perform a method for entropy coding run/data value pair data corresponding to a stream of integer-valued data, said method comprising:
  classifying each data value based on its magnitude;
  if the data value is classified as small, selecting a first code with a first predetermined length, each first code of first predetermined length having a preamble to distinguish large data values, and having a value based on the data value;
  if the data value is classified as large, selecting a first code with a second predetermined length, each first code of second predetermined length having a preamble to distinguish small data values, and having a value based on the data value; and
  outputting the selected first code to a channel.

45. A computer-readable medium encoded with a set of instructions which, when performed by a computer, perform a method for entropy coding run/data value pair data corresponding to a stream of integer-valued data, said method comprising:
  classifying each data value based on its magnitude;
  if the data value is classified as small, selecting a first code comprising k+2 bits from a first codebook, the selected first code having a predetermined preamble for the first bit and whose value for the remaining k+1 bits is based on the data value;
  if the data value is classified as large, selecting a first code comprising N+1 bits from a second codebook, the selected first code having a predetermined preamble for the first bit and whose value for the remaining N bits is based on the data value and N; and
  outputting the selected first code to a channel.

* * * * *

UNITED STATES PATENT AND TRADEMARK OFFICE
CERTIFICATE OF CORRECTION

| | | |
|---|---|---|
| PATENT NO. | : 7,804,428 B2 | Page 1 of 1 |
| APPLICATION NO. | : 12/268171 | |
| DATED | : September 28, 2010 | |
| INVENTOR(S) | : Mitchell Howard Oslick | |

It is certified that error appears in the above-identified patent and that said Letters Patent is hereby corrected as shown below:

In column 9, line 23, in claim 38, after "based" insert -- on --.

Signed and Sealed this
Twenty-ninth Day of November, 2011

David J. Kappos
*Director of the United States Patent and Trademark Office*